United States Patent
Schulz et al.

[11] Patent Number: 5,480,734
[45] Date of Patent: Jan. 2, 1996

[54] RECHARGEABLE ACCUMULATOR

[75] Inventors: Juergen Schulz, Amoeneburg; Bernd Hofacker, Kuenzelsau, both of Germany

[73] Assignee: Adolf Wurth GmbH & Co. KG, Germany

[21] Appl. No.: 115,977

[22] Filed: Aug. 31, 1993

[30] Foreign Application Priority Data

Oct. 10, 1992 [DE] Germany .................. 42 34 231.7

[51] Int. Cl.$^6$ ................................. H01M 10/48
[52] U.S. Cl. ................... 429/7; 429/62; 320/36
[58] Field of Search ............... 429/7, 62, 99, 429/120; 320/36

[56] References Cited

U.S. PATENT DOCUMENTS

| | | | |
|---|---|---|---|
| 2,431,945 | 12/1947 | Little et al. | 429/62 |
| 4,112,201 | 9/1978 | Mabuchi et al. | 429/62 |
| 4,234,839 | 11/1980 | King et al. | 320/36 |
| 4,329,407 | 5/1982 | Gross et al. | 429/120 X |
| 4,507,368 | 3/1985 | Hashimoto | 429/62 |
| 4,560,915 | 12/1985 | Soultanian | 320/35 |
| 4,616,171 | 10/1986 | Hernandez et al. | 320/36 X |
| 4,965,738 | 10/1990 | Bauer et al. | 364/483 |
| 5,017,856 | 5/1991 | Johnson, Jr. | 429/7 X |
| 5,070,427 | 12/1991 | Bush | 320/36 X |
| 5,200,686 | 4/1993 | Lee | 429/7 |

FOREIGN PATENT DOCUMENTS

| | | |
|---|---|---|
| 2367355 | 5/1978 | France . |
| 2542744 | 4/1976 | Germany . |
| 3511988 | 10/1985 | Germany . |
| 3541067 | 5/1986 | Germany . |
| 3611484 | 10/1987 | Germany . |
| 3702591 | 8/1988 | Germany . |
| 3742088 | 6/1989 | Germany . |
| 3801303 | 7/1989 | Germany . |
| 3811371 | 10/1989 | Germany . |
| 3829073 | 12/1989 | Germany . |
| 4014737 | 11/1990 | Germany . |
| 4114576 | 10/1991 | Germany . |
| 4017475 | 12/1991 | Germany . |
| 4027146 | 3/1992 | Germany . |
| 9209062 | 10/1992 | Germany . |
| 4205992 | 9/1993 | Germany . |
| 1064372 | 12/1983 | U.S.S.R. . |
| 2219151 | 11/1989 | United Kingdom . |

OTHER PUBLICATIONS

Patent Abstract of Japan, vol. 7, No. 115, for Kokai #58–35882 (May 1983).
Schweitzer, Helmut: Schnelladen von Nickel–Cadmium–Akkumulatoren mit Sinterelektroden. In: Funkschau 1974, H.3, S.77–79, insb. Bild 4. (month unknown).
Prospekt: Varta Universal–Ladegerat GE 1,2–24/0 1–3 hktwx, der Fa. Varta Batterie AF, Hannover, 1973. (month unknown).

*Primary Examiner*—Stephen Kalafut
*Attorney, Agent, or Firm*—Quarles & Brady

[57] ABSTRACT

At the end of am accumulator discharge process, the accumulator has a raised internal temperature. In order to be able to recharge it again, it is necessary to wait until it has cooled. The charging time is consequently significantly determined by the cooling time. To shorten the charging time, the invention proposes the installation in the accumulator of a temperature sensor and disconnecting the accumulator on reaching a predetermined temperature. Although it is still not empty, it then supplies no further current. However, it can immediately be recharged, so that the cooling time is rendered superfluous. Despite the shorter discharge time, the accumulator is consequently available over a longer period of time.

18 Claims, 3 Drawing Sheets

RECHARGEABLE ACCUMULATOR

The invention relates to a rechargeable accumulator or storage battery for electrically operated equipment.

Electric tools are in particular included among the electrically operated equipment, which is operated at present by means of accumulators. The use of an accumulator-operated tool is particularly advantageous during erection operation, because no extension cables have to be used and there is no risk of the cable being damaged by the tool.

In the case of said tools the accumulators are combined into accumulator packs, which can easily be attached to the tool. If the accumulator is empty, it is replaced by a second, full accumulator. The now empty accumulator can be placed in a charger. In order to reduce the time required to make the empty accumulator available again, fast chargers have been proposed, which are able to recharge an accumulator in a short time. It would be ideal if the charging time was the same as the accumulator use time with one charge.

It is known that the charging of an accumulator is a function of its temperature. If an accumulator is too hot, the current capacity which can be stored therein decreases. Therefore the commercially available chargers have an automatic temperature device, which prevents a charging of the accumulator when it is still hotter than roughly 45° C. To the charger charging time must then be added the accumulator cooling time, which is much longer than the charging time. As a result the advantage of a possible rapid charging is lost.

The problem of the invention is to provide a possibility of so shortening the recharging time of an accumulator, that in permanent operation a user only requires two accumulators, which drive the electrical device in alternating form.

According to the invention this problem is solved by an accumulator with the features of claim 1, whilst further developments form the subject matter of the subclaims.

The invention is based on the finding that towards the end of the discharge of the accumulator in the electrical device, the accumulator temperature rises. Instead of completely utilizing the accumulator capacity, the invention interrupts the current output of the accumulator prior to its deep discharge. The apparent disadvantage of a roughly 5% shorter discharge time is more than compensated by the fact that at this time the accumulator has a temperature which allows its immediate recharging, also rapid charging. This makes it possible to recharge the accumulator during the time when the second accumulator is operating the electrical device. It is also possible to charge the accumulator in a specifically designed charger, which uses a higher charging current.

If the accumulator is to be operated with longer intervals, then the release temperature is only reached at a time at which the accumulator is more strongly discharged and here again recharging can immediately take place. Thus, the invention converts an apparent disadvantage into an advantage.

The release temperature at which the accumulator is switched off, can be modified by the circumstances of the individual case. It is in particular possible to set the cut-off temperature higher than the hitherto standard temperature of 45° C. above which commercially available chargers do not charge. Thus, throughout the charging time, as a result of the charging process, there is a certain temperature drop. This can be assisted by providing a cooling device in the charger, e.g. a fan.

According to the invention the switching device for interrupting the connection has a bimetallic switch, which thus contains the temperature sensor.

According to a further development of the invention the accumulator has an electronic circuit, which contains and/or controls a switch for interrupting the connection. The temperature sensor can also be part of the electronic circuit, e.g. a resistor with a temperature-dependent resistance value.

The switch can e.g. be an electronic switch, i.e. e.g. a switching transistor. In particular, the invention proposes that the switch is formed by a relay. In the standby mode, i.e. without energizing, said relay forms the connection between the accumulator and the accumulator contact. Only when the release temperature is exceeded is the relay operated and the switch opened. This also means that the current consumption for the additionally required switching device is low.

The relay can also be replaced by a thyristor, a transistor or a triac.

The possibility proposed by the invention is in particular intended to be usable in the case of electric tools. The case then occurs of the tool being permanently used, optionally interrupted by brief intervals. Reference is made in exemplified manner to the screwing in of screws or the drilling of holes. After producing the hole or screwing down a screw, work is interrupted, before the next operation commences.

To give the tool user a prior warning that the accumulator will shortly reach its release temperature, according to the invention on reaching the release temperature and prior to the interruption of the connection, the switching device gives a signal to warn the user.

A particularly favourable possibility of giving notice of the disconnection of the connection is that the switching device briefly interrupts the connection on reaching the release temperature and subsequently switches in again for a certain time before the connection is definitively interrupted. The first brief interruption can have such a short duration that the user will just notice that an interruption has occurred, i.e. it will e.g. last one second. The duration of the switching in operation can be such that in the case of the indicated example the working process can just be completed, i.e. the screw can be completely screwed down.

Another possibility proposed by the invention comprises on reaching the release temperature the interruption of the connection should be delayed until the accumulator current output has dropped to zero, which is a sign that the user has switched off the electric tool. This would also mean that the interruption of the connection and therefore the disconnection of the accumulator always takes place in a working interval.

According to the invention, after a long period of e.g. 1 to 2 minutes, the circuit is reset to its initial state, so that following the charging of the accumulator the processes can take place from the beginning again.

According to the invention the switch interrupting the connection can be bridged by a power diode, so that even when the switch is open immediate charging is possible and in the case of a higher switch hysteresis the accumulator can be recharged with normal and possibly already existing chargers.

Since, according to the invention, immediately the accumulator is removed from the electrical device its charging can commence, in a further development of the invention a suitable charger for said accumulator is proposed, which does not have a temperature disconnect, which makes impossible a charging of the accumulator above the indicated temperature of approximately 45°. However, according to the invention, it can be provided that the charger has an accumulator cooler, so that it can be cooled somewhat to the most favourable temperature during charging. In order to reduce the cell temperature, the accumulator casing can have ventilation slits, which further speed up the cooling process.

According to the invention the charger operates with a high frequency pulsed current, so as to keep the thermal loading low.

Thus, the invention creates a possibility of ensuring by measures on the accumulator that the charging times with the chargers are much shorter, so that a user of an electrically driven appliance need only have two alternately operating accumulators. According to the invention, neither is action within the electrically operated device necessary, nor are the hitherto used chargers rendered unusable.

Further features, details and advantages can be gathered from the claims, whose wording is incorporated into the content of the description, together with the following description of a preferred embodiment of the invention and the attached drawings, wherein show:

BRIEF DESCRIPTION OF THE DRAWINGS

As an example for an electrical device, appliance or tool, where the invention can be used, FIG. 1 shows a portable drill 1, which has an electric motor 2 as the drive source. By means of a gear, the electric motor 2 drives a rotary drive with a drill chuck 3. For switching on and off the electric motor 2 a push button 4 is provided on the front of the handle, which is mechanically connected to an electric switch 5. On the underside of the handle 6 is provided a device for the attachment of an accumulator pack 7, which supplies the current necessary for driving the electric motor 2. The accumulator pack contains an accumulator with a series of accumulator cells 9, which supply the current. The electrical connection between the accumulator pack 7 and the drill takes place with the aid of plug connections, which are only indicated by lines in the drawing. The plug connections are also used for inserting the accumulator pack 7 in a charger and undergo charging therein.

Figure 1:
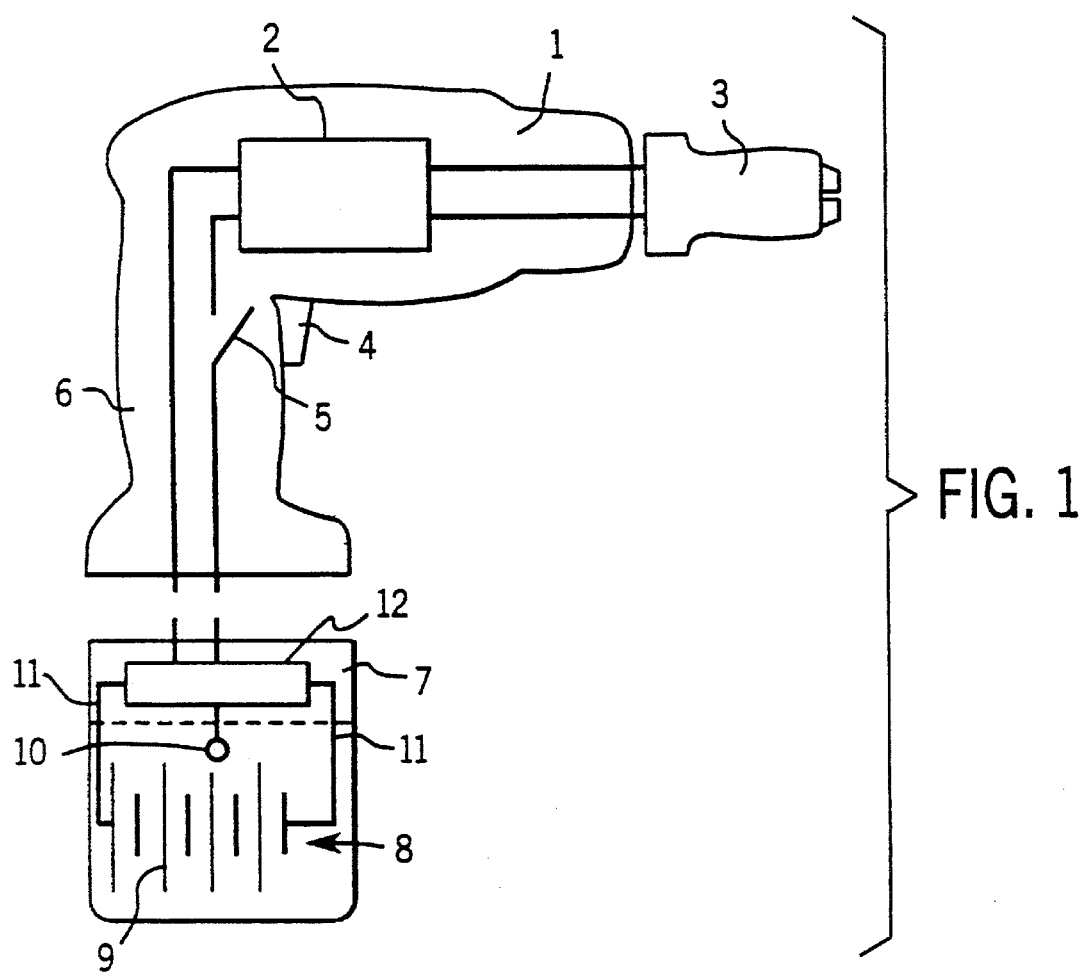
FIG. 1 Diagrammatically a portable drill with an accumulator according to the invention.

The accumulator pack 7 has a temperature sensor 10, which is positioned in such a way that it can determine the temperature of the cells 9 of the accumulator 8. The lines 11 leading away from the cells 9 are carried in an e.g. electronic circuit 12, which in the normal case, i.e. at a lower temperature, switches the connecting wires 11 through to the plug connections. However, as soon as the temperature sensor 10 indicates a temperature exceeding a preset release temperature, then the circuit 12 disconnects the voltage from at least one of the plug connections. Even if the switch 5 is closed, the electric motor 10 receives no power on reaching this temperature.

In the simplest case, which is not shown in detail, the temperature sensor could be in the form of a bimetallic element, which is e.g. directly connected to a switch replacing the electronic circuit 12.

Figure 2:
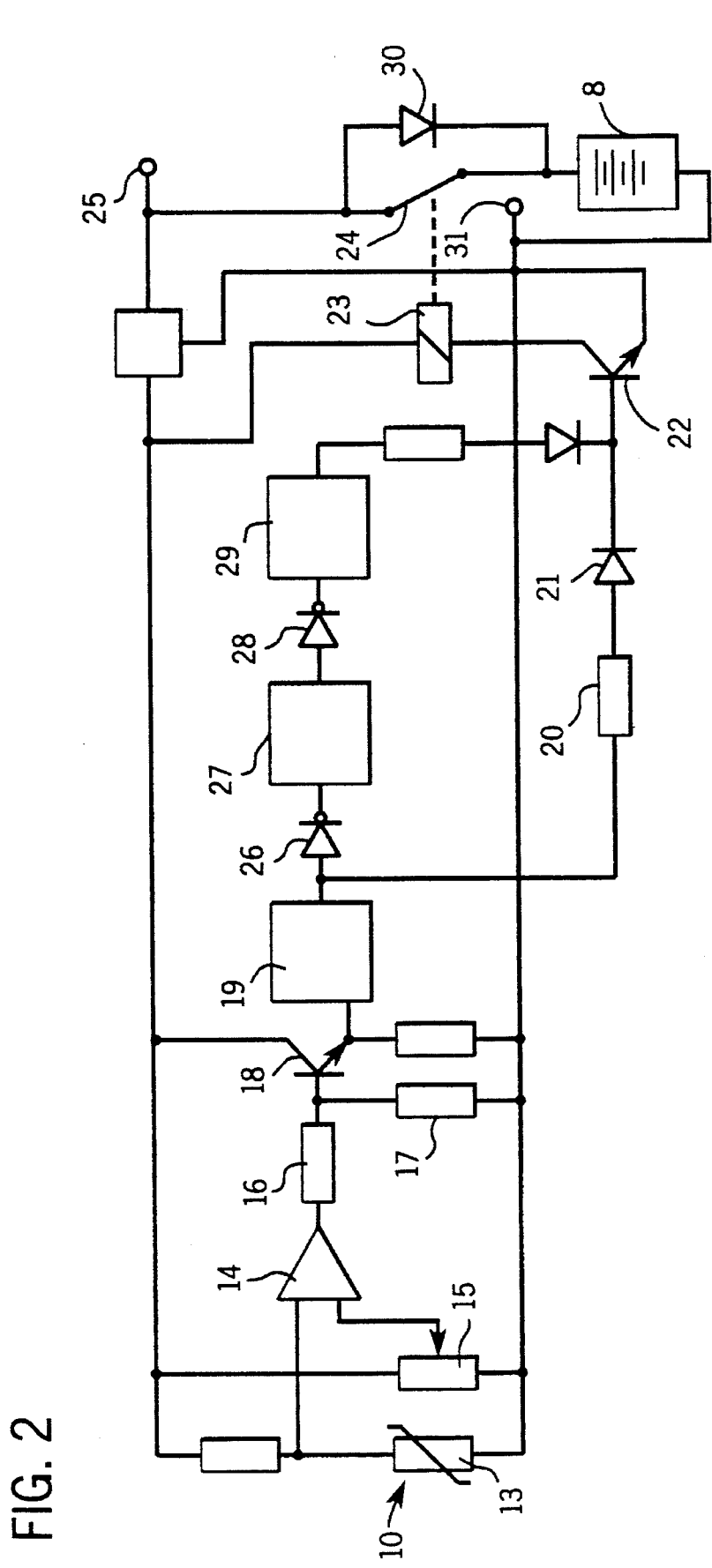
FIG. 2 A block diagram of a possible embodiment of the invention.

FIG. 2 shows a preferred embodiment of the invention, where the electronic circuit 12 is illustrated in greater detail. The accumulator 8 is shown bottom right in FIG. 2. The temperature sensor 10, which is firmly connected to the accumulator 8, is shown to the left in FIG. 2 for reasons of better representation. In the embodiment shown it is formed by a resistor 13 with a temperature-dependent resistance value.

The temperature-dependent resistor 13 is applied to an input of an operational amplifier 14 operating as a comparator.

To the other input of the operational amplifier 14 is applied a voltage, which can be set with the aid of a trimmer resistor 15. The setting possibility is naturally not intended for the final consumer and instead takes place in the factory, so that the trimmer resistor 15 can also be replaced by two fixed resistors. For example the resistance value is set in such a way that it corresponds to a temperature of 58° C. If the voltage threshold corresponding to this temperature is exceeded, the output voltage of the operational amplifier 14 becomes positive. The transistor 18 is then switched through by means of a series resistor 16 and a base resistor 17. A multivibrator 19 connected to the emitter of the transistor 18 receives a positive permanent pulse, so that its output also supplies a positive pulse, whose length can be fixed by the values of the multivibrator 19.

No details of the multivibrator are shown. The positive output pulse of the multivibrator 19 is applied across a resistor 20 and a diode 21 to the second switching transistor 22 and switches through the latter, so that the relay 23 is supplied with power and as a result is pulled up and opens the switch 24. Consequently the connection of the accumulator 8 to output terminal 25, 31 is opened.

The length of the multivibrator output pulse is e.g. fixed at a few seconds. On cancelling out this pulse the switch 24 consequently switches back, so that voltage is again applied to the output terminal 25.

The output of the multivibrator 19 is inverted by means of an inverter 26 and supplied to a second multivibrator 27. Its output once again produces a pulse, whose length can be fixed by data of the multivibrator 27. This pulse is again inverted at 28 and supplied to a third multivibrator 29. The latter once again produces a positive pulse, whose length can be fixed by data of the multivibrator 29.

In the case of the first pulse supplied by the first multivibrator 19 to the transistor 22 the relay is switched on for the duration of this pulse and the accumulator is switched off. As a result of its polarity, no current can flow across the power diode 30 positioned parallel to the switch 24. After a few seconds the relay drops out again and the accumulator again supplies current for a few seconds, so that it is possible to complete a screwing or drilling process which has just commenced. The duration of this reconnection is fixed by the data of the second multivibrator 27.

Following this short reconnection with the aid of a pulsed determined by the third multivibrator, the relay is definitively switched on again, so that the connection is finally interrupted and the accumulator no longer supplies any power.

At the end of this longer pulse, which e.g. takes place after 1 to 2 minutes, the relay drops out again, so that the original state is restored. This is necessary in the case of the circuit shown, so that it is once again in the starting state and consequently during the next discharge cycle the above-described process can take place again.

In the disconnected state, i.e. if the accumulator has a temperature of e.g. 58° C., its charging in the charger can immediately take place, because also with the switch 4 open the charger current can flow through the power diode 30 into the accumulator. This obviously only applies for the case where a charger is used, which can charge at a temperature higher than the standard 45° C. Due to the charging process, during charging there is initially a certain cooling, which can be assisted and increased by a fan installed in the charger.

The charging state of the accumulator can be monitored in the charger by the charging terminal voltage and charging time, so that an overcharging with its negative consequences is avoided.

Figure 3:
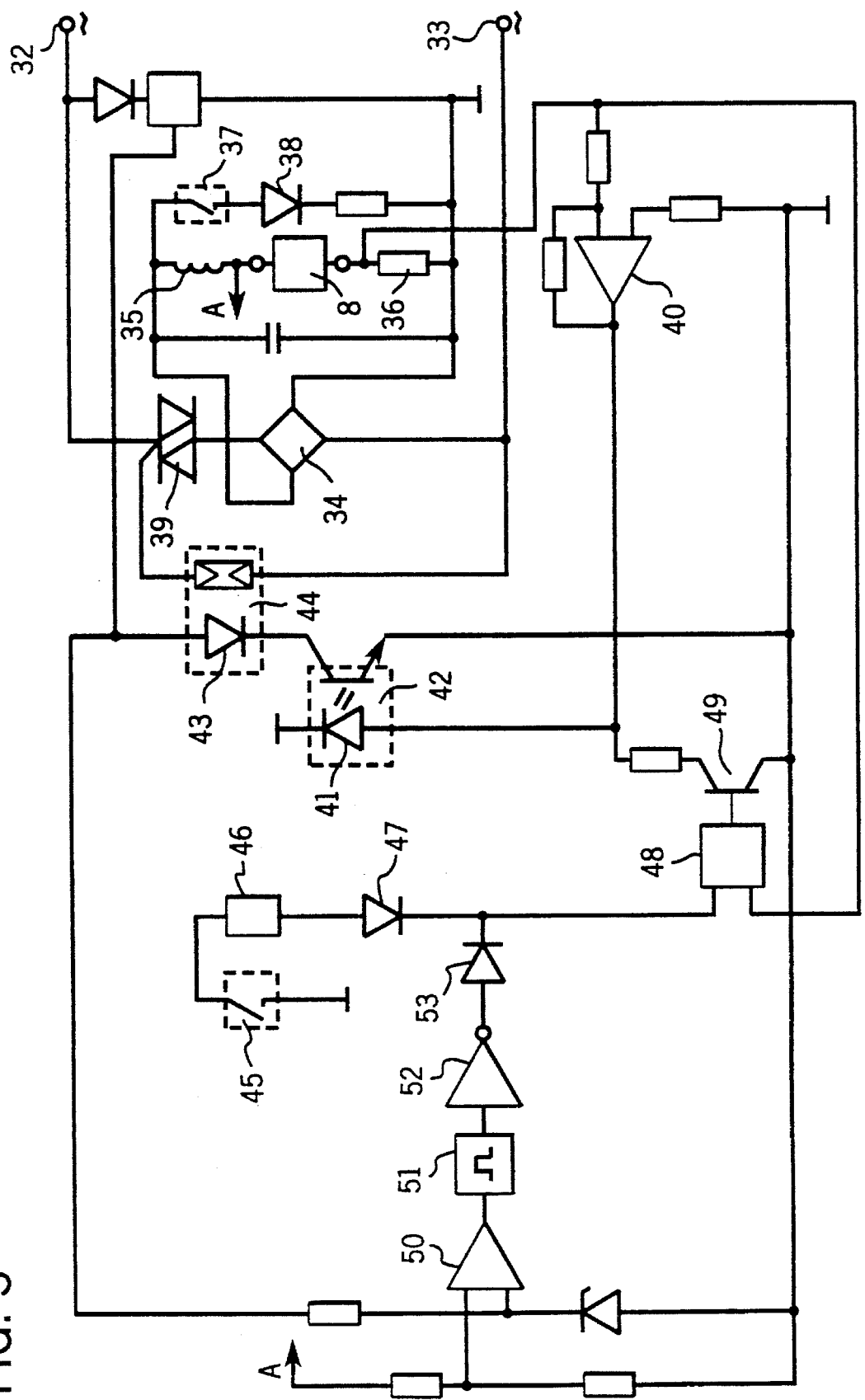
FIG. 3 A block diagram of a charger proposed by the invention.

FIG. 3 shows a block diagram of a charger proposed by the invention and which is specifically adapted to the accumulator pack proposed by the invention. In FIG. 3, terminals A—A represent an interconnection. The accumulator pack 7 with the accumulators 8 contained therein is inserted in a holder or socket of the charger and the electrical connection is made with the accumulator terminals. The charger contains a charging part shown top right in FIG. 3 and to which is applied an a.c. voltage of the desired level. This a.c. voltage can cone from a transformer power supply or a switching power supply and is applied to the terminals 32, 33. In a rectifier 34 the a.c. voltage is converted into d.c. voltage and the latter is filtered. The filtered d.c. voltage is applied to the accumulator 8 across a coil 35 and a measuring resistor 36. The magnetic field produced in the coil 35 switches on a reed switch 37, which supplies power to a light emitting diode 38, which indicates the charging process. The switching on of the power supply can e.g. be initiated by plugging the accumulator pack into the charger socket. In the load circuit there is a triac 39 in series with the rectifier 34 and it regulates the loading current through the accumulator 8.

At the measuring resistor 36 is taken a voltage dependent on the current through the accumulator 8 and is supplied to the inverting input of an operational amplifier 40. The voltage supplied by the output of the operational amplifier 40 is also dependent on the current flowing through the measuring resistor 36, but is phase-displaced. The voltage supplied decreases with a higher current flow and increases with a lower current flow. The voltage is applied to the light emitting diode 41 of an optical coupler 42 and controls to a greater or lesser extent the photosensitive transistor of the optical coupler 42. In series with the said transistor there is a light emitting diode 43 of a second optical coupler 44, which either controls a photoresistor or a photosensitive field effect transistor, which is located in the gate circuit of the triac 39. As a function of the control of this photoresistor or field effect transistor, the gate circuit controls the current through the triac 39. In this way the charging current through the accumulator is regulated independently of the number of cells of the accumulator pack to be charged. Due to the fact that it is disconnected prior to its deep discharge, the accumulator can be charged with a higher charging current and consequently the charger supplies a higher charging current that conventional chargers. To prevent the insertion of a conventional accumulator in the charger, at the plug-in unit of the charger is provided a raised nose or projection and at the same point on the accumulator pack there is a slot or depression. Thus, conventional accumulator packs cannot be inserted in the charger.

The charging process is monitored in both a time and a voltage-dependent manner. At the start of the charging process either by means of a magnet in the accumulator pack or by the magnetic field produced in the coil 35, a reed switch 45 is closed, which triggers the timing element 46. At the end of the set time, across the diode 47, the timing element 46 supplies a positive pulse to one input of a bistable multivibrator 48. The output of this multivibrator controls a switching transistor 49, which short-circuits the voltage supplied from the output of the operational amplifier 40 and consequently interrupts the charging process with the aid of the triac 39. The timing element can also be switched on in some other way.

The comparator 50 shown in FIG. 3 monitors the charging terminal voltage. As soon as this voltage is reached, the monostable multivibrator 51 is started by the output of the comparator 50 and the signal inverted by the inverter 52 is supplied across a diode 53 to the input of the bistable multivibrator 48. The latter then terminates the charging process in the above-described manner.

Thus, the charging process is ended both on the occurrence of the charging terminal voltage and at the end of a predetermined time, as a function of which event occurs first. The bistable multivibrator 48 is reset by a pulse, which is emitted when the accumulator pack is removed from the charger. The charger can have a fan, which is switched on in temperature-controlled manner and cools the accumulator during charging.

For disconnecting the charging current, apart from a triac 39, it is also possible to use a relay, a transistor or a thyristor.

We claim:

1. An accumulator pack with accumulator cells for connection to an electrical device through two electrical contacts, a temperature sensor for sensing the temperature of the accumulator cells during discharge of the accumulator, and a switching device operatively connected to the temperature sensor, and responsive to the temperature sensor sensing a temperature corresponding to an accumulator discharge time limit, to cause emission of a user-perceptible signal and, after a time interval, to interrupt the connection of at least one of the accumulator cells to at least one of the electrical contacts.

2. An accumulator pack according to claim 1, wherein the temperature sensor includes a bimetallic element.

3. An accumulator pack according to claim 1 wherein the switching device for interrupting the connection is a solid state circuit.

4. An accumulator pack according to claim 3, wherein the switch is formed by a relay.

5. An accumulator pack according to claim 3, wherein the switch is formed by a thyristor.

6. An accumulator pack according to claim 3, wherein the switch is formed by a transistor.

7. An accumulator pack according to claim 3, wherein the switch is formed by a triac.

8. An accumulator pack according to claim 1, wherein the time interval between emission of the user-perceptible signal and the interruption of the connection is approximately one second.

9. An accumulator pack according to claim 1, wherein the switching device is further responsive to the temperature sensor sensing the temperature corresponding to the accumulator discharge time limit to interrupt the connection so that current discharge from the accumulator drops to zero.

10. An accumulator pack according to claim 1, wherein the switching device is further responsive to the temperature sensor sensing the temperature corresponding to the accumulator discharge time limit to interrupt the connection, and then restore the connection for a timed period to allow completion of an operation.

11. An accumulator pack according to claim 1, wherein after a timed period following the interruption of the connection, the switching device is reset to an initial state for supplying electrical power.

12. An accumulator pack according to claim 1, wherein the switch interrupting the connection is bridged by a power diode.

13. A charger for a chargeable accumulator, having a voltage supply, a connection for the accumulator to be charged and a cooling device for cooling the accumulator in response to the accumulator being charged.

14. A charger according to claim 13, wherein the voltage supply operates with a pulsed current of sufficiently high frequency to limit thermal loading on the charger.

15. A charger according to claim 13, wherein the voltage supply is provided by a constant charging current.

16. A charger according to claim 13 without a temperature disconnect that would limit charging to temperatures at or below 45° C.

17. A charger according to claim 13, wherein the cooling device comprises a fan.

18. A charger according to claim 13, further comprising means for limiting charging to a timed period or a voltage threshhold whichever is reached first.

* * * * *